the lamps and the circuit board, with each reflector having an aperture in alignment with a corresponding aperture in the circuit board. The lamps are divided into upper and lower groups, with the circuit board having an upper connector coupled to the lower group of lamps and a lower connector coupled to the upper group of lamps, whereby one group of lamps functions as an extender for the other group to reduce the "red-eye" photographic effect. Connected in series with each but the first lamp of each group is a radiant-energy-activated quick-connect switch comprising a patch of heat shrinkable polymeric material attached to the circuit board and extending across a respective one of the apertures therein, a fixed contact attached to a first portion of the circuitry, and a resilient movable contact, such as a segment of spring wire, connected at one end to a second portion of the circuitry and having a bent segment at the other end which contacts the polymeric material in alignment with the respective aperture. The movable contact overlies the fixed contact and is held in a preenergized spaced apart relationship therefrom by the bent segment bearing against the polymeric material. Upon ignition of a flashlamp aligned with the respective aperture, the resulting radiant output rapidly melts away the heat shrinkable material from the aperture and thereby releases the movable contact to resiliently engage the fixed contact as the bent segment enters the circuit board aperture.

United States Patent [19]

Colville et al.

[11] 4,087,849
[45] May 2, 1978

[54] MULTILAMP PHOTOFLASH UNIT HAVING RADIANT-ENERGY-ACTIVATED QUICK-CONNECT SWITCH

[75] Inventors: William T. Colville; David W. Mecone, both of Williamsport, Pa.; Emery G. Audesse, Beverly, Mass.

[73] Assignee: GTE Sylvania Incorporated, Stamford, Conn.

[21] Appl. No.: 772,055

[22] Filed: Feb. 25, 1977

[51] Int. Cl.² .............................................. G03B 15/02
[52] U.S. Cl. ................................... 362/13; 431/95 R
[58] Field of Search ............ 431/95 R, 95 A; 362/17, 362/18, 324, 4, 6, 11, 13

[56] References Cited

U.S. PATENT DOCUMENTS

| 3,562,508 | 2/1971 | Hoffacker | 431/95 |
| 4,036,578 | 7/1977 | Herman | 362/113 |

Primary Examiner—Carroll B. Dority, Jr.
Assistant Examiner—R. J. Charvat
Attorney, Agent, or Firm—Edward J. Coleman

[57] ABSTRACT

A photoflash lamp array comprising a plurality of low voltage filament-type flashlamps mounted on a printed circuit board containing circuitry for sequentially igniting the flashlamps in response to successive low voltage firing pulses applied thereto. A plurality of reflectors respectively associated with the flashlamps are disposed 21 Claims, 5 Drawing Figures U.S. Patent    May 2, 1978    4,087,849

MULTILAMP PHOTOFLASH UNIT HAVING RADIANT-ENERGY-ACTIVATED QUICK-CONNECT SWITCH

BACKGROUND OF THE INVENTION

This invention relates to multilamp photoflash devices having circuit means for sequentially igniting the flashlamps and, more particularly, to improved switching means for permitting reliable flashing of an array of low voltage filament-type photoflash lamps in rapid succession.

Numerous multilamp photoflash arrangements with various types of sequencing circuits have been described in the prior art, particularly in the past few years. Series and parallel-connected lamp arrays have been shown which are sequentially fired by mechanical switching means, simple electrical circuits, switching circuits using the randomly varied resistance characteristics of the lamps, arc gap arrangements, complex digital electronic switching circuits, light-sensitive switching means and heat-sensitive switching devices which involve melting, fusing or chemical reaction in response to the radiant energy output of a proximate flashed lamp. Examples of previous heat-sensitive switching devices employed in flashlamp arrays are described in the following U.S. Pat. Nos. 3,774,020; 3,726,631; 3,728,068; 3,728,067; 3,714,407; 3,668,421; 3,692,995; 3,666,394; 3,458,270; 3,459,487; 3,459,488; 3,473,880; 3,544,251; 3,443,875; 3,552,896 and 3,562,508.

The present invention is concerned with an improved radiant-energy-activated switching means useful in a relatively inexpensive photoflash unit of the disposable type. In particular, the proposed switching means is particularly advantageous in photoflash arrays employing low voltage filament-type lamps adapted to be ignited sequentially by successively applied low voltage firing pulses from a source such as a camera-shutter-actuated battery switch.

A currently marketed photoflash unit, described in U.S. Pat. No. 3,894,226 and referred to as a flip flash, comprises a planar array of eight high voltage type flashlamps mounted on a printed circuit board with an array of respectively associated reflectors disposed therebetween. The lamps are arranged in two groups of four disposed on the upper and lower halves, respectively, of the rectangular shaped circuit board. A set of terminal contacts at the lower end of the unit is provided for activation of the upper group of lamps, while a set of terminal contacts at the top of the unit is operatively associated with the lower group of lamps. The application of successive high voltage pulses (e.g. 500 to 4,000 volts from, say, a piezoelectric source controlled by the shutter of a camera in which the array is inserted) to the terminal contacts at the lower end of the unit causes four lamps at the upper half of the array to be sequentially ignited. The array may then be turned end for end and again inserted into the camera in order to flash the remaining four lamps.

The flip flash circuit board comprises an insulating sheet of plastic having a conductive circuit pattern, including the terminal contacts, on one side. The flashlamp leads are electrically connected to this circuit by means of eyelets secured to the circuit board and crimped to the lead wires. The circuitry on the board includes six printed, normally open, connect switches, that chemically change from a high to low electrical resistance, so as to become electrically conducting after exposure to radiant heat energy from an ignited flashlamp operatively associated therewith. The purpose of the switches is to promote lamp sequencing and one-at-a-time flashing. The four lamps of each group are arranged in parallel, with three of the four lamps each being connected in series with a respective thermal connect switch. Initially only the first of the group of four lamps is connected directly to the high voltage pulse source. When this first lamp flashes, it causes its associated thermal contact switch (which is series connected with the next, or second, lamp) to become permanently conductive. Because of this action, the second lamp of the group of four is connected to the pulse source. This sequence of events is repeated until all four lamps have been flashed.

A thermal connect switch of the general type discussed above is described in the aforementioned U.S. Pat. No. 3,458,270 of Ganser et. al. as comprising a mass of silver oxide together with a polyvinyl resin binder. Upon exposure to radiant heat, a chemical reaction occurs in which the silver oxide is converted to metallic silver. Unfortunately, such a switch, based entirely on silver oxide, is disadvantageous commercially in that it is unstable under conditions of elevated temperature and high humidity and, consequently, has a limited shelf life. A more recently disclosed switch of this general type is described in U.S. Pat. No. 3,990,833 of Holub et al as being prepared from compositions which impart improved shelf life to the switches under conditions of high relative humidity. More specifically, the improved switch compositions comprise at least seventy percent by weight of a carbon containing silver salt, such as silver carbonate, up to thirty percent by weight of silver oxide, and an organic polymer binder. The patent indicates that the initial resistance of the radiation switch was about $10^{10}$ ohms, and after activation by flashing, the resistance was found to be in the order of 0.1 to 10 ohms. The current source described in the examples for firing the flashlamps was a piezoelectric cell providing a pulse of about 2 kilovolts for a duration of 5 microseconds. Although providing satisfactory switching operation from such high voltage sources, it appears questionable that silver switches of this general type would consistently provide reliable sequential flash operation in an array of filament type flashlamps triggered from a low voltage battery source providing an output pulse of about 2 volts. In such a low voltage array, it would appear that a clean metal to metal contact would be required to provide a reliable electrical connection to the next lamp to be fired.

One of the aforementioned patents, namely, U.S. Pat. No. 3,728,068, describes a similar parallel circuit arrangement in which the heat sensitive switches each comprise a pair of electrical contacts held apart by a chemical or plastic material which melts or otherwise deforms when heated by the radiant output of an ignited flashlamp, thereby permitting the contacts to close and electrically connect the next lamp in the array across the firing pulse terminals. The physical arrangement of these switches is not more specifically defined, however, In another of the aforementioned patents, namely, U.S. Pat. No. 3,562,508, a similar parallel circuit arrangement includes heat sensitive switches comprising a meltable pin passing through a hole in the reflector behind the lamp to hold a resilient switch contact in the open position; upon flashing of an adjacent lamp the pin melts and the switch contacts close to connect the next lamp into the circuit. The switches described in these two patents may overcome the problem of providing a direct metal to metal contact, however, it would appear that the melting or deforming of a fusible pin or other plastic member normally holding the contacts apart could result in a comparatively slow switching action. For camera applications requiring a capability whereby the lamps can be flashed one or two seconds apart, the described switching mechanisms of melting or deforming such fusible members would not appear to provide a sufficiently rapid and fail-safe closed circuit to low voltage pulses.

SUMMARY OF THE INVENTION

Accordingly, it is an object of the present invention to provide a photoflash unit having improved switching means for providing reliable flashing of an array of photoflash lamps in rapid succession.

A principal object of the invention is to provide a radiant-energy-activated quick-connect switch for a photoflash unit which is operative in response to the radiation from an ignited flashlamp to rapidly provide a reliable closed circuit to low voltage pulses.

Still another object of the invention is to provide a multilamp photoflash array having a plurality of inexpensive radiant-energy-activated, quick-connect switches.

Yet another object is to provide a low voltage multilamp photoflash array which reduces the photographic "red-eye" effect and employs improved radiant-energy-activated quick-connect switches.

These and other objects, advantages and features are attained, in accordance with the invention, by providing a multilamp photoflash unit or array comprising a printed circuit board having circuitry thereon, a plurality of flashlamps positioned over a surface of the circuit board and having lead-in wires connected to the circuitry, and a subplurality of radiant-energy-activated quick-connect switches each connected to a selected lamp of the unit. Each of the connect switches comprises an aperture through the circuit board in alignment with a respective flashlamp, a support member of fusible material extending across the aperture and attached to the circuit board, a fixed contact attached to a first portion of the circuitry, and a resilient movable contact attached at one end to a second portion of the circuitry and having a bent segment at the other end which contacts the fusible support member in alignment with the aperture. The movable contact overlies the fixed contact and is held in a preenergized spaced apart relationship therefrom by the bent segment bearing against the fusible member. Preferably, the movable member comprises a segment of spring wire and the fusible support member comprises a patch of heat shrinkable polymeric material. Upon ignition of a lamp aligned with the aperture, the portion of the heat shrinkable material covering the aperture rapidly melts, shrinks and separates in response to the radiant output of the lamp, thereby releasing the movable contact to resiliently engage the fixed contact as the bent segment enters the aperture, thus providing a quick-acting, reliable closed circuit to low voltages.

By way of example, the connect switches are preferably fabricated from mono- or biaxially oriented film, such as polyester, polystyrene or polypropylene. The performance of the material can be enhanced by applying a coating or spot of dark, heat-absorbing ink or other similar material onto the surface facing the flashlamp. The piece of material may be self-adhesive, and pressure applied to the desired circuit board location.

A switch of this type is relatively inexpensive and suitable for application using high speed, automated production machinery, particularly in the case of self-adhesive patches that may be pressure-applied. The spatially suspended (over the circuit board aperture) heat shrinkable material is operative in response to radiant-heat-energy from an ignited flashlamp to very rapidly provide a reliable closed circuit since it relies not merely on a change of phase (melting) of the switch material, but it also involves a rapid change in dimension (heat shrinking). For example, connect switches of this type can operate in about 35 milliseconds, thereby permitting high flash sequencing rates. Further, oriented polymeric film inherently provides a high degree of mechanical integrity; hence, a suspended film of the material will reliably remain intact, without cracking or breaking, when subjected to the handling and vibration that photoflash units can be expected to encounter.

BRIEF DESCRIPTION OF THE DRAWINGS

This invention will be more fully described hereinafter in conjunction with the accompanying drawings, in which.

DESCRIPTION OF PREFERRED EMBODIMENT

Figure 1:
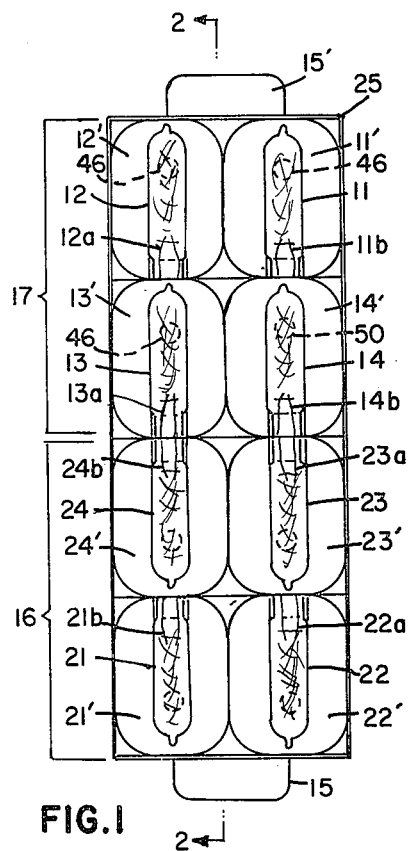
FIG. 1 is a front elevation of a multilamp photoflash array in accordance with the invention.
Figure 2:
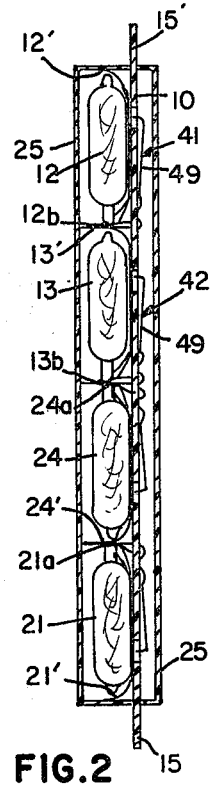
FIG. 2 is a sectional view taken along lines 2—2 of FIG. 1.
Figure 3:
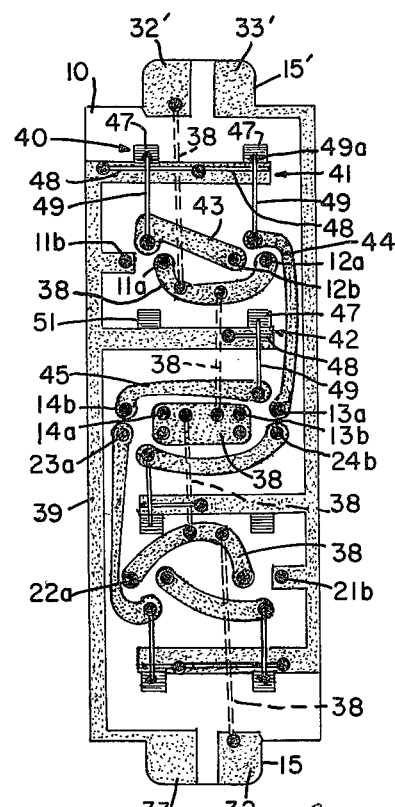
FIG. 3 is a rear elevation of a printed circuit board used in the array of FIG. 1, the circuit board including quick-connect switches in accordance with the invention.

FIGS. 1-3 illustrate portions of a multilamp photoflash unit having an exterior configuration similar to the aforementioned U.S. Pat. No. 3,894,226; the construction differs therefrom, however, in that the lamps are of the low voltage filament type (rather than high voltage), the conductive circuit pattern is somewhat different and printed on the rear side of the circuit board, and the ignition sequencing circuit has been modified to include connect switches in accordance with the invention. The unit includes a planar array of eight low voltage, filament-type flashlamps 11-14 and 21-24 mounted on a printed circuit board 10, with an array of respectively associated reflectors 11'-14' and 21'-24' disposed therebetween. The array is provided with a plug-in connector tab 15 at the lower end thereof which is adapted to fit into a camera or flash adaptor. A second plug-in connector tab 15' is provided at the top end of the unit, whereby the array is adapted to be attached to the camera socket in either of two orientations, i.e. with either the tab 15 or the tab 15' plugged into the socket. The lamps are arranged in two groups of four disposed on the upper and lower halves respectively of the rectangular shaped array. Upper group 17 comprises lamps 11-14, and lower group 16 includes lamps 21-24; the reflectors 11', etc., are disposed behind the respective lamps so that as each lamp is flashed, light is projected forwardly of the array. The lamps are arranged and connected so that when the array is connected to the camera by the connector tab 15, only the upper group 17 of lamps will be flashed, and when the array is turned end for end and connected to the camera by the other connector tab 15′, only the then upper group 16 of lamps will be flashed.

The above mentioned components are packaged in a rectangular box-like plastic container 25, which may comprise two pieces of plastic that are secured together. The entire container may be molded from a generally clear plastic material, or at least the window portions in front of the flashlamps are rendered light transmitting. The window portions may also be tinted for color correction purposes. Sandwiched between the front and back walls of the container 25, in the order named and as generally illustrated by FIG. 2 are the flashlamps 11, etc., a reflector member (preferably of aluminum-coated plastic) shaped to provide individual reflectors 11′, etc., the printed circuit board 10 provided with the integral connector tabs 15 and 15′, and an indicia sheet (not shown), which may be provided with instructions, information, trademarks, and other indicia such as flash indicators located behind selected lamps which change color due to heat radiation from a flashing lamp, thus indicating at a glance that selected lamps have been flashed or not flashed.

The tab 15, which is integral with the circuit board 10, is provided with a pair of electrical terminals 32 and 33, and similarly the tab 15′ is provided with a pair of terminals 32′ and 33′, for contacting terminals of a camera socket for applying firing voltage pulses to the array.

The circuit board 10 has a "printed circuit" thereon, as will be described, for causing sequential flashing of the lamps by firing voltage pulses applied to the terminals 32, 33 or 32′ or 33′. The top and bottom halves of the printed circuitry preferably are reversed mirror images of each other. The lead wires 11a, 11b, etc. of the lamps 11 etc., may be attached to the circuit board 10 in various ways, such as by passing the lead wires through openings 36 (FIG. 4) in the board and soldering the end of the lead to the conductive circuit pattern on the rear side of the board. The lead wires pass through openings 35 (FIG. 4) in the reflective member to reach the circuit board holes 36.

Terminals 32 and 32′ are included in an electrical ground circuit run 38 on the board 10 which makes contact with one of the lead wires (11a, 12a, 13b and 14a) of each of the lamps. It will be noted that the circuit run 38 actually comprises separated conductive patterns on the rear side of the circuit board which are interconnected by wires (illustrated by dashed lines) passing along the front side of the circuit board (i.e., the lamp and reflector side), with the two ends of each wire passing through holes in the circuit board and being soldered to the respective conductive patterns on the rear side of the board.

Terminal 33 is part of a conductive run 39 that is electrically connected by means of a solder joint to lead-in wire 11b of lamp 11 and terminates at the radiant-energy-activated quick-connect switches 40, 41 and 42 respectively positioned near lamps 11, 12 and 13. A circuit board conductor run 43 is connected electrically to lead wire 12b of flashlamp 12 and terminates at the connect switch 40. A circuit board conductor run 44 is connected to lead wire 13a of lamp 13 and terminates at the connect switch 41. Similarly, a circuit board connector run 45 is connected to lead wire 14b of lamp 14 by means of a solder joint and terminates at connect switch 42.

Figure 4:
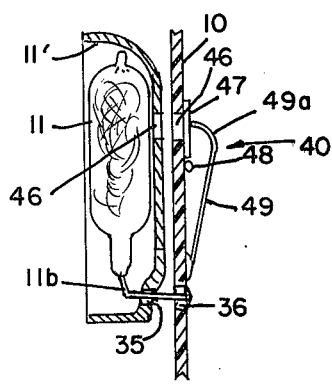
FIG. 4 is an enlarged sectional schematic showing the alignment of an individual lamp of the array of FIG. 1 with respect to its reflector and circuit board switch.

In accordance with the present invention, and as best illustrated in FIG. 4 each radiant-energy-activated quick-connect switch comprises the following elements. An aperture 46 is provided in the circuit board behind each of the lamps 11, 12 and 13, the aperture for each switch being in alignment with the flashlamp by which that switch is to be activated. Extending across each of the apertures 46 is a fusible support member 47 which is attached to the circuit board about the periphery of the aperture. Preferably, support member 47 is in the form of a patch covering the aperture 46 and comprises a heat shrinkable polymeric material which is self-adhesive on at least a portion of one side to facilitate attachment to the circuit board. Each switch further includes a fixed contact 48 which is attached to an extending portion of conductor run 39 of the printed circuit. For example, a fixed contact may comprise a segment of conductor wire attached by a solder joint to the conductor run 39. A resilient movable contact 49 is attached at one end to a respective one of the conductor runs 43, 44 or 45 and has a bent segment 49a at the other end which contacts fusible support member 47 in alignment with the aperture 46. It will be noted that the movable contact 49 is arranged to overlie the fixed contact 48 and is held in a preenergized spaced-apart relationship from the fixed contact by the bent segment 49a bearing against the fusible member 47. In the preferred embodiment, the movable contact comprises a segment of spring wire, such as phosphor bronze spring wire, which is soldered in place at the fixed end to a respective one of the conductors 43, 44 or 45.

To facilitate radiation transfer from a flashed lamp to its corresponding connect switch, each of the reflectors 11′, 12′ and 13′ includes an aperture 46 in alignment with a corresponding aperture 46 in the printed circuit board which in turn is in alignment respectively with the support member 47 of the connect switches 40, 41 and 42. Accordingly, when one of the lamps 11, 12 or 13 is ignited, the resulting radiant output passes through the adjacent aligned apertures 46 to fuse or melt away a portion of the support member 47 from the circuit board aperture. As the movable member 49 of the switch that is directly behind the ignited lamp is spring loaded to bias its bent segment 49a against the support member 47, the foregoing effect of the lamp radiation results in a rapid release of the movable contact to resiliently engage the fixed contact 48, with the bent segment 49a entering the circuit board aperture 46.

Figure 5:
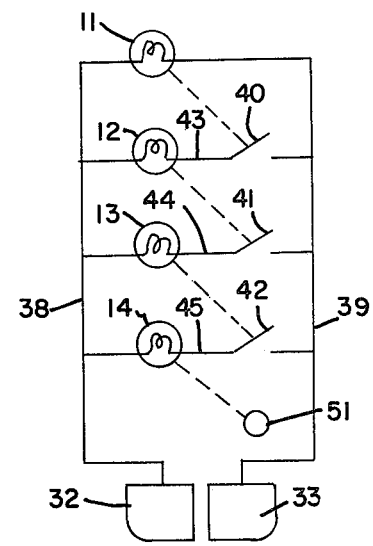
FIG. 5 is a circuit diagram for the top half of the photoflash array of FIGS. 1-3.

Referring to FIG. 3 and the correspondingly numbered circuit diagram of FIG. 5, the normally open connect switch 40 is coupled in series with lamp 12 and adapted via apertures 46 to respond to the radiant output of lamp 11 when that lamp is ignited; connect switch 41 is coupled in series with lamp 13 and adapted to respond to the output of lamp 12; and connect switch 12 is coupled in series with lamp 14 and adapted to respond to the output of lamp 13. Lamp 11, the first lamp in the sequence to be flashed, is of course directly connected across the terminals 32 and 33.

The reflector and circuit board area behind lamp 14 also has a pair of aligned apertures 50, illustrated by dashed lines in FIG. 1. A patch of colored heat shrinkable polymeric material 51 (FIG. 3) is disposed to cover the circuit board aperture 50 to function as a flash indicator, whereby flashing of the last lamp 14 to be ignited in the group melts the associated heat shrinkable patch 51 from its aperture 50 to indicate to a user that the associated group of lamps has been expanded. This change in color appearance of the flash indicator 51 may be made visible to the user by providing a suitable aperture (not shown) in any indicia sheet inserted in the back of the array package.

Preferably, each of the support members 47 comprises a piece of heat shrinkable polymeric material which is attached to the circuit board about the periphery of its associated aperture, with the mid portion of the polymeric material covering the aperture. This arrangement maximizes the speed with which the shrinking and separation of the mid portion of the switch element 47 occurs upon its being heated by the radiant output of an ignited flashlamp. More specifically, each support member 47 comprises a thin patch of plastic preferably fabricated from mono- or biaxially oriented polyethylene, polypropylene, polystyrene, polyester or nylon. The performance can be enhanced by applying a coating or spot of dark light absorbing ink or other similar material unto the surface of the polymeric material which faces the flashlamp via its corresponding aperture 46. The piece of switch material may be self-adhesive and pressure applied to attach the ends of the patch to the circuit board as illustrated. By locating the connect switch patches across the apertures 46, each element of heat shrinkable material is positioned so as to be in operative relationship with the radiant output of its respective lamp via the reflector and circuit board apertures 46. Hence, upon ignition of a given flashlamp, the switch material is radiantly heated so that it weakens and softens as well as shrinks. A separation occurs near the center of the piece, and the peripheries of the separation shrink back away from each other so as to rapidly and abruptly release the spring loaded contact 49. The measured time between the application of flashing voltage to the lamp and the closing of a connect switch, using the preferred heat shrinkable patch 47, is approximately 35 milliseconds. This necessitates that the contacts in the camera must be arranged to remove the flashing voltage from the array contacts before the switch closes. The recommended synchronizing contact duration is between 10 and 25 milliseconds. Accordingly, high flash sequencing rates are permitted. For example, the lamps in multilamp arrays using such connect switches sequence properly with the low voltage pulses timed less than one-half second apart. This is faster than one can manually advance the film to actuate the shutter mechanism in most cameras, let alone framing the picture subject.

It will be noted that the side of the circuit board 10 facing the reflectors and lamps has no circuit pattern other than for the interconnecting ground wires 38 (illustrated by dashed lines in FIG. 3). Hence, no insulating insert is required between the reflectors and the circuit board. The remainder of the circuitry, the tab terminals, and the switches are all located at the rear side of the circuit board. The lower portion of the circuit board contains a substantially reverse mirror image of the same circuit shown on the upper part of the circuit board, and therefore will not be described in detail. It will be noted that the circuit runs from the plugged-in terminals 32 and 33 at the lower part of the circuit board extend upwardly so as to activate the circuitry in the upper half of the circuit board. Similarly, when the unit is turned around and tab 15' is plugged into a socket, the circuit board terminals 32' and 33' will be connected to and activate the lamps which will then be in the upper half of the circuit board, and hence in the upper half of the flash unit. This accomplishes the desirable characteristic whereby only the group of lamps relatively farthest away from the lens axis will be flashed thereby reducing the possiblity of the phenomena known as "red-eye".

The circuit on the circuit board 10 functions as follows. Assuming that none of the four lamps in the upper half of the unit have been flashed previously, upon occurrence of a first firing pulse applied across terminals 32, 33, this pulse will be directly applied to the lead-in wires of the first connected flashlamp 11, whereupon the lamp 11 flashes and becomes an open circuit between its lead-in wires. Heat and/or light radiation from the flashing first lamp 11 is operative via its respective reflector and circuit board apertures 46 to activate the connect switch 40. As a result, the radiation causes the normally open connect switch 40 to become a closed circuit by melting and shrinking away patch 47 to provide quick release of movable contact 49 into engagement with fixed contact 48. The closure of switch 40 connects the circuit board terminal 33 electrically to lead-in wire 12b of lamp 12 via conductor run 43. By the time this occurs, the firing pulse has diminished to a value insufficient to cause the second lamp 12 to flash. When the next firing pulse occurs, it is applied to the lead-in wires of the second lamp 12 via the now closed connect switch 40, whereupon the second lamp 12 flashes, thereby causing connect switch 41 to close. When the next firing pulse occurs, it is applied via now closed connect switch 41 and circuit run 44 to lead-in wire 13a of the third lamp 13, thereby firing that lamp, whereupon the radiation from lamp 13 activates connect switch 42 to become a closed circuit. Thus, the next firing pulse will be applied via now closed connect switch 42, and conductor run 45, to lead-in wire 14b of the fourth flashlamp 14, thereupon causing that lamp to flash. The radiation from lamp 14 activates the flash indicator 51 to alert the user that the last lamp in the active circuit group has been fired. The foregoing description traces the circuit route through to the "hot" side of the lamp; however, it should be clear that the firing pulses are actually applied across both lead-in wires of each lamp via conductor runs 38 and 39 and the respective switching circuitry.

Additional flashlamps, radiant-energy-activated switches, and electrical conductors can be employed, if desired, using the just applied principle. When the flash unit is inverted and the other connector tab 15' attached to the camera or socket, the group of lamps that then become uppermost and relatively farthest away from the lens axis will be in an active circuit and will be flashed in the same manner as has been described. In a preferred embodiment, the lamps 11, etc., are low voltage filament types requiring about one and one half or two volts, for example, for flashing, and they can be fired by a shutter actuated switch in a low voltage battery circuit.

By way of specific example only, the fusible material 47 used in the illustrated embodiment comprises a small square of biaxially oriented polystyrene of 3 mil thickness, with the side adjacent to the lamps colored black. The plastic should be spaced from the fixed contact 48, as illustrated, to assure that no residue is left between the switch contacts when the material vaporizes which could inhibit good electrical contact. The measured time between the application of flashing voltage to the lamp and the closing of the switch, with the above recommended plastic, is approximately 35 milliseconds.

As discussed hereinbefore, the connect switch support members 47 are preferably fabricated from a mono- or biaxially oriented polymeric film. Biaxially oriented polypropylene, nylon, or polyester films are preferred materials because of their mechanical toughness and resistance to attack by the solvents used in compositions that may be employed in silk screening of the circuit. A heat shrinking material is particularly desired because of the intended dimensional changes, when subjected to radiant heat, contribute to the desired fast acting switching characteristics. Some polymeric films which are not heat shrinkable may be usable to provide switch opening characteristics approaching that of the heat shrinkable film, but the mono- and biaxially oriented materials (which are thus heat shrinkable) possess a higher degree of mechanical integrity and thus assure the maintenance of reliable connect switches, without mechanical loosening or breaking apart when the unit is subjected to handling and vibration.

Although the invention has been described with respect to specific embodiments, it will be appreciated that modifications and changes may be made by those skilled in the art without departing from the true spirit and scope of the invention. For example, in addition to application in the described planar arrays adapted for two-ended operation, connect switches in accordance with the invention may also be used in single-ended linear, arrays of photoflash lamps, similar to the units known as flash bars.

What we claim is:

1. In a multilamp photoflash unit containing a plurality of flashlamps and a printed circuit board having electrical circuitry thereon for sequentially igniting said flashlamps, at least one radiant-energy-activated quick-connect switch included in said circuitry, said switch having a normally open configuration and being arranged in series with a second one of said flashlamps for providing a closed circuit thereto in response to the ignition of a first one of said flashlamps, said switch comprising:
   an aperture through said circuit board in alignment with said first flashlamp;
   a support member of fusible material extending across said aperture and attached to said circuit board;
   a fixed contact attached to a first portion of said circuitry; and
   a resilient movable contact attached at one end to a second portion of said circuitry and having a bent segment at the other end which contacts said fusible support member in alignment with said aperture, said movable contact overlying said fixed contact and being held in a preenergized spaced-apart relationship therefrom by said bent segment bearing against said fusible member, whereby the radiant output of said ignited first lamp is operative to fuse the support member from said aperture and thereby release the movable contact to resiliently engage the fixed contact as the bent segment enters said aperture.

2. The unit of claim 1 further including a reflector positioned between said first flashlamp and one side of said circuit board and having an aperture in alignment with the aperture in said circuit board.

3. The unit of claim 1 wherein said fusible support member is a piece of heat shrinkable plastic material.

4. The unit of claim 3 wherein said heat shrinkable material is in the form of a patch covering the aperture in said circuit board.

5. The unit of claim 3 wherein said fixed contact is a segment of conductor wire and said movable contact is a segment of spring wire.

6. The unit of claim 3 wherein said heat shrinkable material comprises a polymeric material.

7. The unit of claim 6 wherein said polymeric material is blackened on at least a portion of the surface thereof facing said first flashlamp.

8. The unit of claim 6 wherein said polymeric is mono- biaxially oriented.

9. The unit of claim 8 wherein said polymeric material is polyethylene, polypropylene, polystyrene, polyester or nylon.

10. The unit of claim 3 wherein said heat shrinkable material is self-adhesive on at least portions of one side thereof to facilitate attachment to said circuit board.

11. A photoflash lamp array comprising, in combination: a printed circuit board having circuitry on a first surface thereof; a plurality of flashlamps positioned over a second surface of said circuit board and having lead-in wires connected to said circuitry, said first and second surfaces being on opposite sides of said circuit board and said circuitry being provided for sequentially igniting said flashlamps; a plurality of reflectors respectively associated with said flashlamps and positioned between said lamps and said circuit board; at least a subplurality of said reflectors having an aperture therein; a respective subplurality of apertures in said circuit board in alignment respectively with the apertures of said reflectors; and a respective subplurality of radiant-energy-activated quick-connect switches attached to said first surface of said circuit board and associated respectively with the apertures of said circuit board, each of said switches having a normally open configuration and being electrically connected in said circuitry in series with a respective one of said flashlamps for providing a closed circuit thereto after ignition of another respective one of said flashlamps, each of said switches comprising a piece of polymeric material attached to said circuit board and extending across a respective one of the apertures therein, a fixed contact attached to a respective first portion of said circuitry, and a resilient movable contact attached at one end to a respective second portion of said circuitry and having a bent segment at the other end which contacts said polymeric material in alignment with the respective aperture, said movable contact overlying said fixed contact and being held in a preenergized spaced relationship therefrom by said bent segment bearing against said polymeric material, whereby the radiant output of an ignited lamp via respectively aligned reflector and circuit board apertures is operative to melt the polymeric material from said respective circuit board aperture and thereby release the movable contact to resiliently engage the fixed contact as the bent segment enters said respective circuit board aperture.

12. The array of claim 11 wherein the polymeric material of each of said quick-connect switches is heat shrinkable.

13. The array of claim 12 wherein said flashlamps are of the low voltage filament type adapted by means of said circuitry to be ignited sequentially by successively applied low voltage firing pulses, said flashlamps are coupled in parallel with each other through said connect switches, and each of said connect switches is operative upon ignition of a flashlamp aligned with its associated apertures and in response to the resulting radiation therefrom to reliably provide a closed circuit for low voltage to a respective one of said lamps in about 35 milliseconds.

14. The array of claim 12 wherein the heat shrinkable polymeric material of each of said switches is in the form of a patch covering the respective aperture in said circuit board.

15. The array of claim 12 wherein the fixed contact of each of said switches is a segment of conductor wire and each of said movable contacts is a segment of spring wire.

16. The array of claim 12 wherein each of said pieces of heat shrinkable material is blackened on at least a portion of the surface thereof facing the respective aperture in the circuit board.

17. The array of claim 12 wherein said polymeric material is mono- or biaxially oriented.

18. The array of claim 17 wherein said polymeric material is polyethylene, polypropylene, polystyrene, polyester or nylon.

19. The array of claim 12 wherein each of said pieces of heat shrinkable material is self adhesive on at least one portion of one side thereof to facilitate attachment to said circuit board.

20. The array of claim 11 wherein said flashlamps and reflectors are arranged in a planar array and divided into upper and lower groups, all the lamps of the upper group being located above all the lamps of the lower group, said circuit board includes an upper connector means and a lower connector means, a portion of said circuitry couples said upper connector means to each lamp of said lower group of lamps, and another portion of said circuitry couples said lower connector means to each lamp of said upper group of lamps, each of said coupling portions enabling flashing of the lamp in the group coupled thereto in response to flash activation signals applied to its associated connector means, thereby reducing red-eye photographic effects.

21. The array of claim 20 wherein the reflector associated with the last lamp to be ignited in each group has an aperture therein, said circuit board has an aperture in alignment with said last-mentioned reflector aperture for each group, and a patch of colored heat shrinkable polymeric material is disposed to cover the last-mentioned circuit board aperture of each group to function as a flash indicator, whereby flashing of the last lamp to be ignited in each group melts the associated heat shrinkable patch from its aperture to indicate to a user that the associated group of lamps has been expended.

* * * * *